(12) United States Patent
Wert et al.

(10) Patent No.: US 6,384,631 B1
(45) Date of Patent: May 7, 2002

(54) VOLTAGE LEVEL SHIFTER WITH HIGH IMPEDANCE TRI-STATE OUTPUT AND METHOD OF OPERATION

(75) Inventors: Joseph D. Wert; William E. Ballachino, both of Arlington, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/844,183

(22) Filed: Apr. 27, 2001

(51) Int. Cl.[7] ........................................... H03K 19/0948
(52) U.S. Cl. ........................................... 326/68; 326/81
(58) Field of Search ............................ 326/63, 68, 70, 326/71, 80, 81, 83

(56) References Cited

U.S. PATENT DOCUMENTS

| | | | |
|---|---|---|---|
| 4,486,670 A | * 12/1984 | Chan et al. | ................. 326/81 |
| 5,587,676 A | * 12/1996 | Chowdhury | ................. 327/108 |
| 6,002,290 A | * 12/1999 | Avery et al. | ................. 326/65 |

* cited by examiner

*Primary Examiner*—Michael Tokar
*Assistant Examiner*—Don Phu Le

(57) ABSTRACT

There is disclosed a voltage level shifter that receives an input signal having a maximum Logic 1 value of VDD and produces an output signal having a maximum Logic 1 value of VDDI/O, where VDDI/O is greater than VDD. The voltage level shifter comprises: 1) a first circuit branch comprising A) a first p-type transistor having a source coupled to a first power supply having a level of VDDI/O and B) a first n-type transistor having a source coupled to ground, a drain coupled to a drain of the first p-type transistor, and a gate coupled to the input data signal; and 2) a second circuit branch comprising A) a second p-type transistor having a source coupled to the first power supply and a gate coupled to a drain of the first n-type transistor and B) a second n-type transistor having a source coupled to ground, a drain coupled to i) a drain of the second p-type transistor and ii) a gate of the first p-type transistor, and a gate coupled to an inverted copy of the input data signal, wherein a drain current of the first p-type transistor is larger than a drain current of the second p-type transistor for the same gate-to-source voltage, such that the first p-type transistor turns on faster than the second p-type transistor if the first power supply is powered up to VDDI/O when the first and second n-type transistors are off.

20 Claims, 3 Drawing Sheets

US 6,384,631 B1

VOLTAGE LEVEL SHIFTER WITH HIGH IMPEDANCE TRI-STATE OUTPUT AND METHOD OF OPERATION

TECHNICAL FIELD OF THE INVENTION

The present invention is generally directed to integrated circuits and, in particular, to voltage level shifters for driving output lines of an integrated circuit.

BACKGROUND OF THE INVENTION

In recent years, there have been great advancements in the speed, power, and complexity of integrated circuits, such as application specific integrated circuit (ASIC) chips, random access memory (RAM) chips, microprocessor (uP) chips, and the like. These advancements have made possible the development of system-on-a-chip (SOC) devices. A SOC device integrates into a single chip all (or nearly all) of the components of a complex electronic system, such as a wireless receiver (i.e., cell phone, a television receiver, and the like). SOC devices greatly reduce the size, cost, and power consumption of the overall system.

Reductions in power consumption are particularly important in SOC devices. SOC devices are frequently used in portable devices that operate on battery power. Since maximizing battery life is a critical design objective in a portable device, it is essential to minimize the power consumption of SOC devices that may be used in the portable device. Furthermore, even if an SOC device is not used in a portable device, minimizing power consumption is still an important objective. The increased use of a wide variety of electronic products by consumers and businesses has caused corresponding increases in the electrical utility bills of homeowners and business operators. The increased use of electronic products also is a major contributor to the increased electrical demand that has caused highly publicized power shortages in the United States, particularly California.

To minimize power consumption in electronic devices, particularly SOC devices, many manufacturers have reduced the voltage levels at which electronic components operate. Low power is integrated circuit (IC) technology operating at +3.3 volts replaced IC technology operating at +5.0 volts. The +3.3 volt IC technology was, in turn, replaced by +1.6 volt IC technology in many applications, particularly microprocessor and memory applications.

However, as the operating voltage of an integrated circuit is reduced, the noise margins of the integrated circuit are also reduced. Thus, an integrated circuit operating at +1.5 volts has smaller noise margins than a circuit operating at +3.3 volts. In deep submicron VLSI designs, two voltage sources for a chip design are common. One voltage source is an internal core power supply voltage (i.e., VDD) that has a lower swing voltage than the second voltage source, which provides the output pad ring voltage (i.e., VDDI/O). Common range values may include a VDD of 1–1.5 volts and a VDDI/O range of 2.3–3.6 volts.

The internal core circuitry running on VDD typically uses thin gate oxides and cannot tolerate the higher external voltages of 2.3–3.6 volts. The transistors used in the pad rings, which interface off the chip to the board and surrounding chips, use a thicker gate oxide and larger minimum L than internal transistors and hence can handle the larger external voltages.

In order for the low voltage transistors to communicate across the boundary from the 1 volt domain to the higher 2.5 volt (typical voltage), some type of voltage level translation must occur. When chip technologies still used internal voltages greater than 2 volts and external voltages were 3.3–5.5 volts, this level translation was relatively easy, and several different methodologies could be used. However, once internal voltages decreased to the 1 volt range, several of the previously used level translation methodologies could no longer be used.

Many processing systems implement conditions in which the output power supply, VDDI/O, may be powered up while the internal core power supply, VDD, is zero. Under this condition, it is desirable to disable the line drivers for the output pads. There are numerous methods for forcing output lines into a high-impedance tristate condition when VDDI/O is powered up and VDD is not. However, most of these methods require a trickle current to establish Vbe values and VDS. A method for accomplishing this without current draw is desirable, especially for systems which run on batteries and may need to go into low-power modes. If this tri-stating function could be accomplished without adding more circuitry, that would be an even larger bonus. Therefore, there is a need in the art for integrated circuits in which output line drivers may be powered up to a known state while internal core circuitry is not powered up. More particularly, there is a need for improved integrated circuits in which output line drivers may be powered up to a high impedance tri-state condition without requiring additional power-on biasing circuitry or extensive design of existing devices.

SUMMARY OF THE INVENTION

To address the above-discussed deficiencies of the prior art, it is a primary object of the present invention to provide a voltage level shifter capable of receiving an input signal having a maximum Logic 1 value of VDD and producing an output signal having a maximum Logic 1 value of VVDI/O, where VDDI/O is greater than VDD. According to an advantageous embodiment of the present invention, the voltage level shifter comprises: 1) a first circuit branch comprising A) a first p-type transistor having a source coupled to a first power supply having a level of VDDI/O and B) a first n-type transistor having a source coupled to ground, a drain coupled to a drain of the first p-type transistor, and a gate coupled to the input data signal; and 2) a second circuit branch comprising A) a second p-type transistor having a source coupled to the first power supply and a gate coupled to a drain of the first n-type transistor and B) a second n-type transistor having a source coupled to ground, a drain coupled to i) a drain of the second p-type transistor and ii) a gate of the first p-type transistor, and a gate coupled to an inverted copy of the input data signal, wherein a drain current of the first p-type transistor is larger than a drain current of the second p-type transistor for the same gate-to-source voltage, such that the first p-type transistor turns on faster than the second p-type transistor if the first power supply is powered up to VDDI/O when the first and second n-type transistors are off.

According to one embodiment of the present invention, a size of the first p-type transistor is larger than a size of the second p-type transistor.

According to another embodiment of the present invention, the first and second n-type transistors are identical.

According to still another embodiment of the present invention, the voltage level shifter further comprises a first inverter having an input coupled to the input data signal and an output coupled to the gate of the second n-type transistor.

According to yet another embodiment of the present invention, the voltage level shifter further comprising a second inverter having an input coupled to the gate of the second p-type transistor.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 6, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged data processing system.

Figure 1:
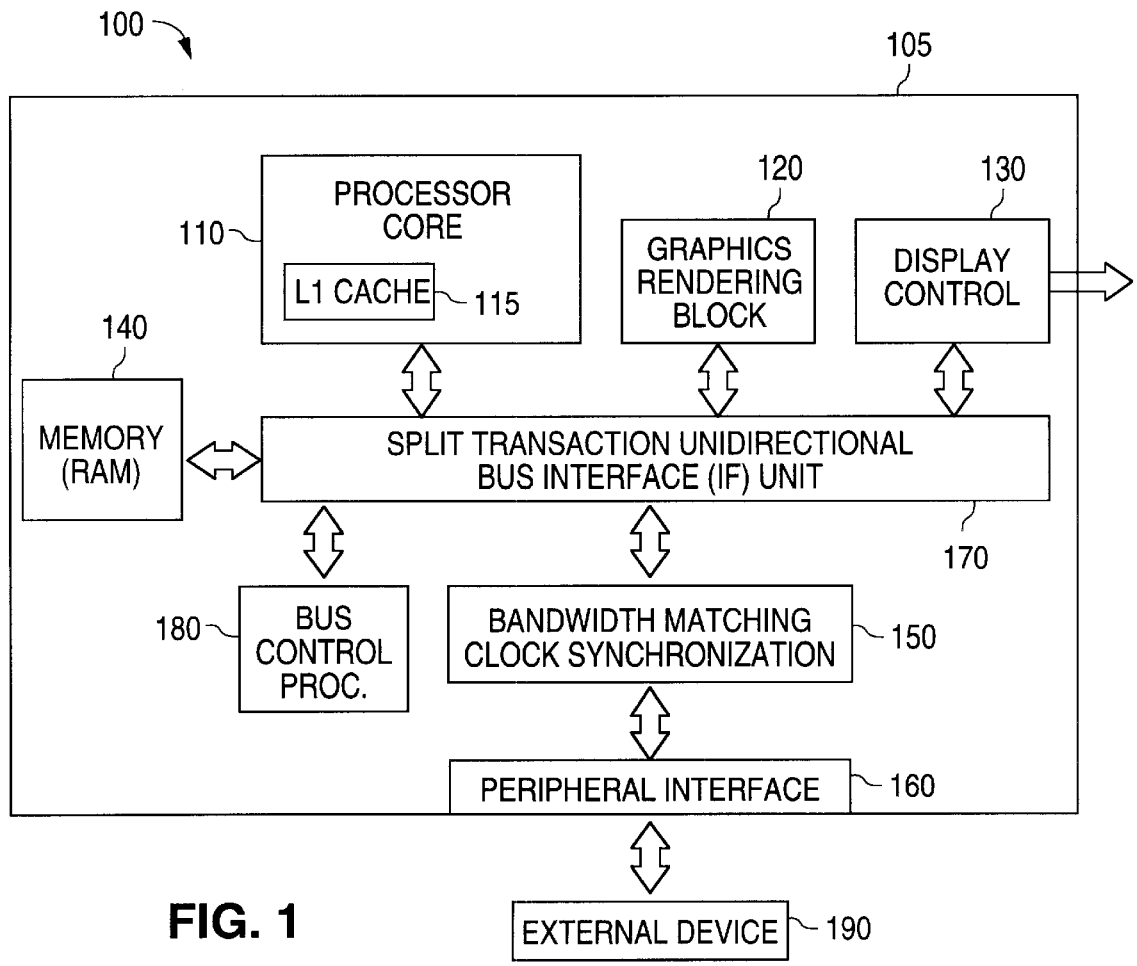
FIG. 1 illustrates a processing system which comprises an exemplary system-on-a-chip (SOC) device according to one embodiment of the present invention.

FIG. 1 illustrates processing system 100, which comprises exemplary system-on-a-chip (SOC) device 105 according to one embodiment of the present invention. SOC device 105 is a single integrated circuit comprising processor core 110, graphics rendering block 120, (optional) display control circuit 130, memory 140, bandwidth matching-clock synchronization interface 150, peripheral interface 160, split transaction, unidirectional bus interface (IF) unit 170 (or bus IF unit 170), and bus control processor 180. Processor core 110 contains internal level one (L1) cache 115. Peripheral interface 160 communicates with external device 190.

Processing system 100 is shown in a general level of detail because it is intended to represent any one of a wide variety of electronic products, particularly consumer appliances. Display controller 130 is described above as optional because not all end-products require the use of a display. Likewise, graphics rendering block 120 may also be optional.

For example, processing system 100 may be a printer rendering system for use in a conventional laser printer. Processing system 100 also may represent selected portions of the video and audio compression-decompression circuitry of a video playback system, such as a video cassette recorder or a digital versatile disk (DVD) player. In another alternative embodiment, processing system 100 may comprise selected portions of a cable television set-top box or a stereo receiver.

Bus IF unit 170 provides high-speed, low latency communication paths between the components coupled to bus IF unit 170. Each component coupled to bus IF unit 170 is capable of initiating or servicing data requests via four unidirectional bus interfaces: two request buses and a two data buses. The request bus contains address lines, byte enable lines (32-bit or 64-bit data reads), cycle type lines, and routing information for transactions. The data bus contains data lines, byte enable lines (for data writes), completion status lines, and routing information to associate the data bus packets with the appropriate request bus packet. As noted, the four buses are unidirectional and point-to-point to minimize loading and timing variations. In addition, bus IF unit 170 provides a diagnostic bus, power management controls, clocks, reset signals, and a scan interface.

Bus IF unit 170 implements a transaction protocol that defines the mechanism for transferring packets between devices coupled to bus IF unit 170. In addition, the transaction protocol defines the control for clocks and power management. The packet protocol standardizes the system level interactions between devices coupled to bus IF unit 170. The hardware requirements for mapping transactions, arbitrating packets, and maintaining coherency is specified in the packet protocol.

Bandwidth matching-clock synchronization interface 150 comprise a queue that bridges ports on bus IF unit 170 that have different widths or different frequencies, or both. Bus control processor 180 controls certain operations of bus IF unit 170 related to clock timing, power management, and diagnostic features. Peripheral interface 160 is a bus device used for chip-to-chip commination between SOC device 105 and an external peripheral device, such as external device 190.

In an advantageous embodiment of the present invention, SOC device 105 may use two VDD power supplies: an internal voltage supply (e.g., VDD=1V) to power internal logic and an input/output (I/O) voltage supply (e.g., VDDI/O=2.5V) to power I/O lines that interface with external circuitry. For example, processor core 110 and bus IF unit 170 may operate at VDD=+1V and the output stage of peripheral interface 160 may operate at VDDI/O=+2.5V. Thus, level shifting circuitry is required to interface the +1V logic gates in SOC device 105 and the +2.5V I/O gates in SOC device 105. Additionally, +2.5V circuitry may be used within SOC device 105 to drive selected internal address and data lines. For example, if memory (i.e., RAM) 140 is large and separated from bus IF unit 170, the address and data lines of memory 140 may be driven by +2.5V power supply rails.

The present invention provides voltage level shifting circuitry (or voltage translation circuitry) that permits logic gates in one voltage domain to communicate with logic gates in another voltage domain. Advantageously, the voltage level shifting circuitry according to the principles of the present invention goes to a known output state if the VDDI/O power supply for the high voltage output stages is powered up while the VDD power supply for the low voltage core logic is OFF.

Figure 2:
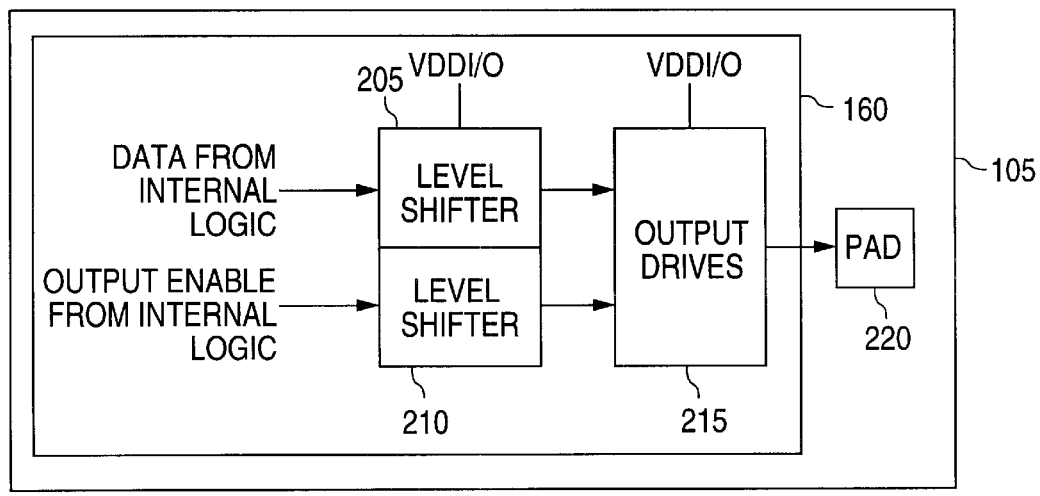
FIG. 2 illustrates in general detail the output stage of the exemplary peripheral interface in SOC device according to one embodiment of the present invention.

FIG. 2 illustrates in general detail the output stage of peripheral interface 160 in SOC device 105 according to one embodiment of the present invention. Peripheral interface 160 comprise level shifter circuit 205, level shifter 210, and output drives 215, which drive contact pad 220. In the illustrated embodiment, level shifter 205 receives data signals from internal logic gates in SOC device 105 that operate at VDD=1V and outputs the data signals to output drives 215 at VDDI/O=2.5V. Output drives 215 also operates at VDDI/O=2.5V and drives pad 220 at +2.5V. Level shifter 210 receives an output enable signal from internal logic gates in SOC device 105 that operate at VDD=1V and outputs the enable signal to output drives 215 at VDDI/O=2.5V. Output drives 215 is a tri-state device and the output enable signal from level shifter 210 switches the output of output drives 215 from a high impedance state to an active state having a value of either Logic 0 or Logic 1.

Figure 3:
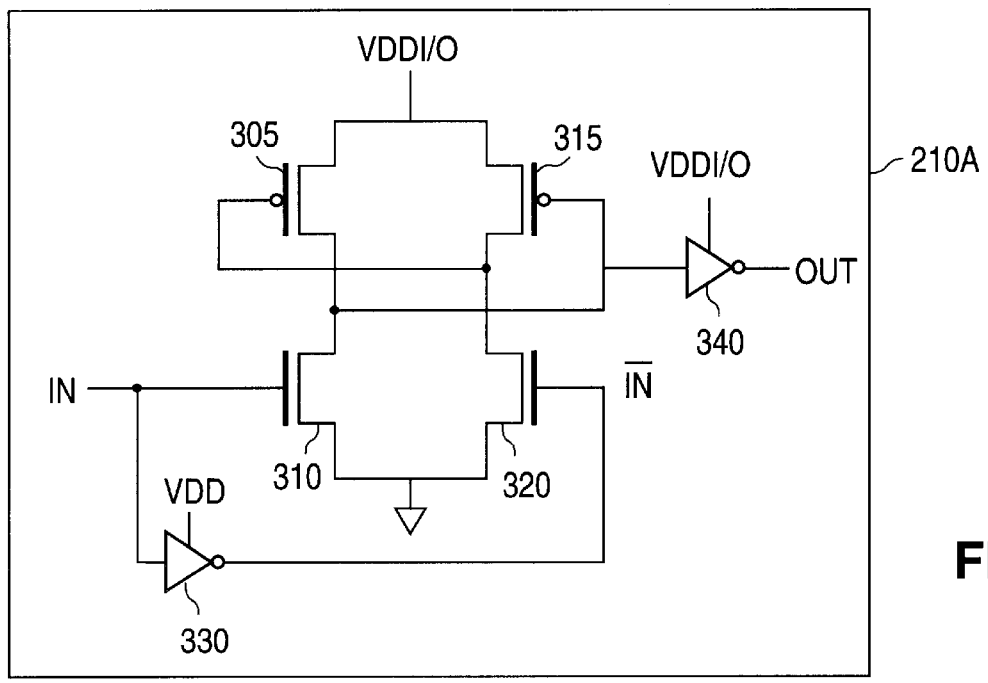
FIG. 3 illustrates exemplary voltage level shifters in detail according to one embodiment of the present invention.

FIG. 3 illustrates voltage level shifter 210A in greater detail according to one embodiment of the present invention. Exemplary level shifter 210 comprises a first circuit leg comprising a series connection of p-type transistor 305 and n-type transistor 310 and a second circuit leg comprising a series connection of p-type transistor 315 and n-type transistor 320. The drains of transistors 305 and 310 are coupled together and the drains of transistors 315 and 320 are coupled together. Voltage level shifter also comprises inverter 330 and inverter 340. The two circuit legs operate between VDDI/O=+2.5V and ground. Inverter 330 operates between VDD=+1V and ground (low voltage domain) and inverter 240 operates between VDDI/O and ground (high voltage domain). The IN signal is a 0V to +1V logic signal (low voltage domain) that is shifted to a 0V to +2.5V logic signal (high voltage domain) at the input of inverter 340.

Inverter 330 inverts the IN signal and applies the inverted value to the gate of transistor 320. If the IN signal is +1V Logic 1, transistor 310 is turned ON and transistor 320 is OFF. The drain of transistor 310, the gate of transistor 315, and the input to inverter 340 are pulled down to ground (i.e., Logic 0). This turns transistor 315 ON and sets the OUT signal on the output of inverter 340 to Logic 1. Also, since transistor 315 is ON and transistor 320 is OFF, the gate of transistor 305 is pulled up to the VDDI/O power supply by transistor 315 and hence transistor 305 is OFF. Since inverter 340 operates at VDDI/O, the Logic 1 on the output of inverter 340 is +2.5V.

If the IN signal is Logic 0, transistor 310 is turned OFF and transistor 320 is ON. The drain of transistor 320 and the gate of transistor 305 are pulled down to ground (i.e., Logic 0). This turns transistor 305 ON and pulls the gate of transistor 315 and the input to inverter 340 up to the VDDI/O power supply. This sets the output of inverter 340 to Logic 0.

Figure 4:
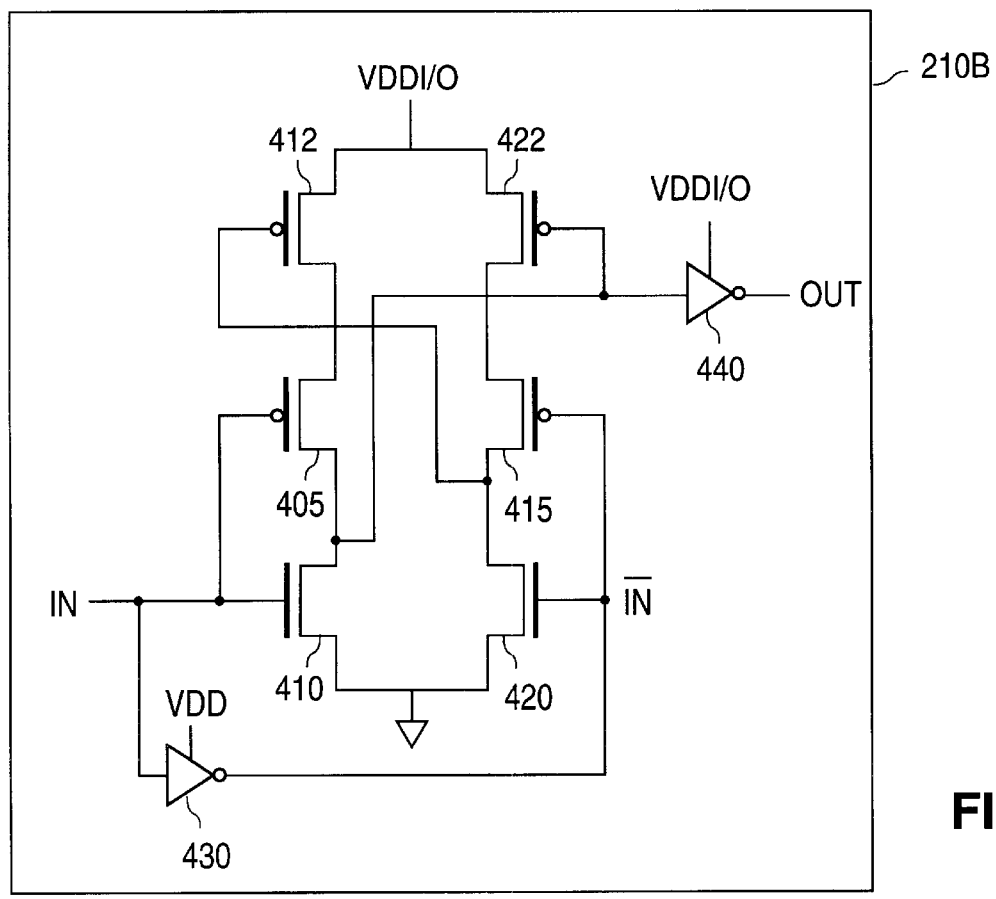
FIG. 4 illustrates exemplary voltage level shifters in detail according to a second embodiment of the present invention.

FIG. 4 illustrates exemplary voltage level shifter 210B in greater detail according to an alternate embodiment of the present invention. Exemplary level shifter 210 comprises a first circuit "leg" comprising a series connection of p-type transistor 412, p-type transistor 405, and n-type transistor 410 and a second circuit "leg" comprising a series connection of p-type transistor 422, p-type transistor 415, and n-type transistor 420. Voltage level shifter also comprises inverter 430 and inverter 440. The two circuit legs operate between VDDI/O=+2.5V and ground. Inverter 430 operates between VDD=1V and ground (low voltage domain) and inverter 440 operates between VDDI/O and ground (high voltage domain). The IN signal is a 0V to +1V logic signal (low voltage domain) that is shifted to a 0V to +2.5V logic signal (high voltage domain) at the input of inverter 440.

Voltage level shifter 210B in FIG. 4 operates in a similar manner to voltage level shifter 210A in FIG. 3. If the IN signal is Logic 1 (in the +1V domain), transistors 410 and 415 are turned ON and transistors 420 and 405 are OFF. The drain of transistor 410, the gate of transistor 422, and the input to inverter 440 are pulled down to ground (i.e., Logic 0). This turns transistor 422 ON and sets the OUT signal on the output of inverter 440 to Logic 1. Also, since transistors 415 and 422 are ON and transistor 420 is OFF, the gate of transistor 412 is pulled up to the VDDI/O power supply by transistors 415 and 422 and hence transistor 412 is OFF. Since inverter 440 operates at VDDI/O, the Logic 1 on the output of inverter 440 is +2.5V.

If the IN signal is Logic 0, transistors 410 and 415 are turned OFF and transistors 420 and 405 are ON. The drain of transistor 420 and the gate of transistor 412 are pulled down to ground (i.e., Logic 0). This turns transistor 412 ON and pulls the gate of transistor 422 and the input to inverter 440 up to the VDDI/O power supply. This sets the output of inverter 440 to Logic 0.

If the circuit "legs" of voltage level shifters 210A and 210B in FIGS. 3 and 4 are designed asymmetrically in a specific way, it is possible to cause the inputs of inverters 340 and 440 to always go to Logic 1 after VDDI/O is powered up while VDD is OFF (or low) and consequently to cause the OUT signal to always go to Logic 0. For FIG. 3, transistor 305 is designed to be larger than transistor 315, while the sizes of transistor 310 and transistor 320 are the same. In such a design, if VDD is OFF (or low) and VDDI/O is powered up to +2.5V, the OUT signal will always go to Logic 0. For FIG. 4, the size of transistor 412 is designed to be larger than the size of transistor 422, the size of transistor 405 is designed to be larger than the size of transistor 415, and the size of transistor 410 is designed to be equal to the size of transistor 420. Again, the OUT signal always comes up to Logic 0 when VDD=0 and VDDI/O is powered up.

It is assumed that the enable signal from level shifter 210 is an active high signal, such that when the OUT signal is Logic 1, the output stages of output drives 215 are active. Similarly, when the OUT signal is Logic 0, the output stages of output drives 215 are in a high impedance tri-state condition. Thus, the Logic 0 on the OUT signal after a power up translates to a high impedance tri-state at the output of output drives 215.

Figure 5:
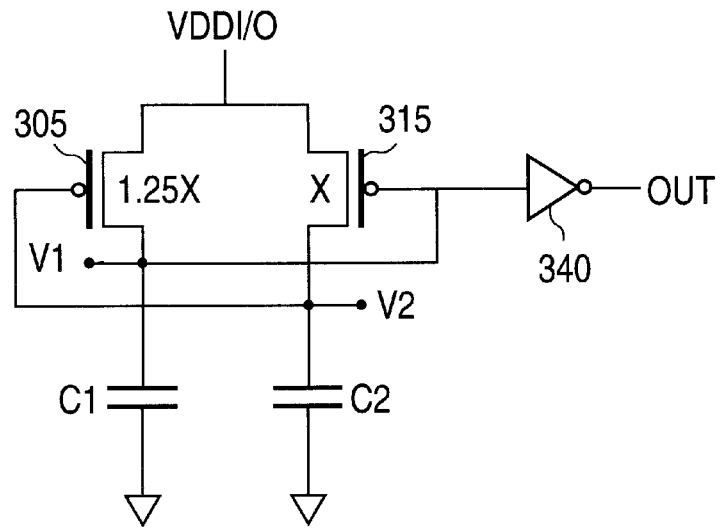
FIG. 5 illustrates the operation of the exemplary voltage level shifters in FIGS. 3 and 4 according to the principles of the present invention.

FIG. 5 illustrates the operation of voltage level shifters 210A and 210B according to the principles of the present invention. For this analysis, voltage level shifter 210A can be simplified to p-type transistors 305 and 315, where the size of transistor 315 is X and the size of transistor 305 is 1.25X (i.e., transistor 305 is larger than transistor 315). With VDD=0 volts, transistors 310 and 320 (which are equal in size) are solidly OFF and may be replaced with by C1 and C2, respectively.

Figure 6:
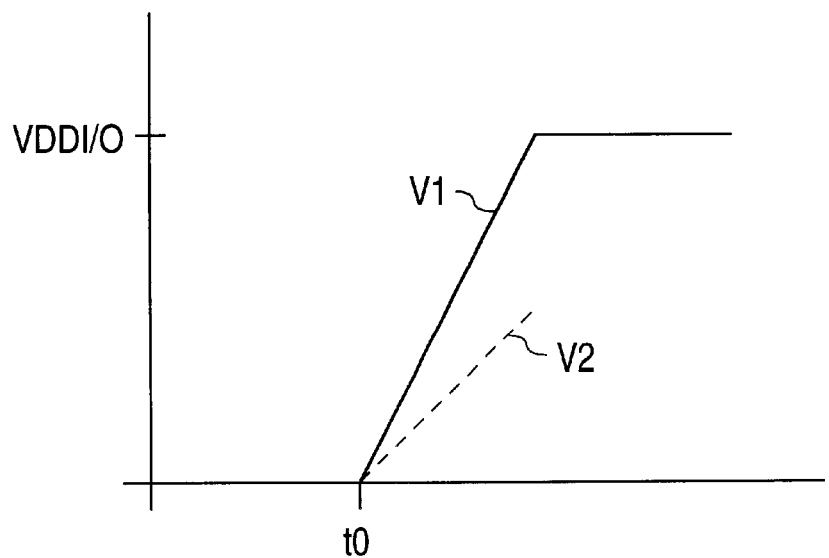
FIG. 6 is a timing diagram illustrating selected signals in the exemplary voltage level shifters in FIGS. 3 and 4.

FIG. 6 is a timing diagram illustrating selected signals V1 and V2 as VDDI/O is powered up. Since C1=C2 and the size of transistor 305 is greater than the size of transistor 315, as VDDI/O is powered up, the voltage at V1 will rise faster than the voltage at V2. This is because, for any Vgs, ID305>ID315, where ID305 is the drain current (ID) of transistor 305 and ID315 is the drain current of transistor 315. As V1 increases faster than V2, the voltage at V1 debiases transistor 315 and eventually shuts transistor 315 completely OFF, thus preventing V2 from rising and shutting off T1. Since V2 is actually prevented from rising by the voltage at V1, V2 is illustrated as a dotted line. Thus, voltage V1 follows VDDI/O up to its final value as it ramps up. The same logical analysis holds for voltage level shifter 210B, which need not be explained further.

Thus, by using the asymmetrical voltage level shifters of FIGS. 3 and 4, the enable signal can be guaranteed by the level shifters to generate an enable low (disabled) signal for VDD=0. Of course, if the system has been up and running and VDD is to be intermittently powered off it would be wise to first take the 1V IN signal low. Once it is taken low and VDD is powered off, the level shifter will effectively "latch" that value until VDD can be powered back up. It should be noted that, in an alternate embodiment of the present invention, the voltage level shifters may be made asymmetrical in each circuit "leg" by increasing the doping in one transistor (rather than increasing the size), thereby creating a larger current drain current for the same Vgs.

Although the present invention has been described in detail, those skilled in the art should understand that they can make various changes, substitutions and alterations herein without departing from the spirit and scope of the invention in its broadest form.

What is claimed is:

1. A voltage level shifter capable of receiving an input signal having a maximum Logic 1 value of VDD and producing an output signal having a maximum Logic 1 value of VDDI/O, where VDDI/O is greater than VDD, said voltage level shifter comprising:
   1) a first circuit branch comprising A) a first p-type transistor having a source coupled to a first power supply having a level of VDDI/O and B) a first n-type transistor having a source coupled to ground, a drain coupled to a drain of said first p-type transistor, and a gate coupled to said input data signal; and
   2) a second circuit branch comprising A) a second p-type transistor having a source coupled to said first power supply and a gate coupled to a drain of said first n-type transistor and B) a second n-type transistor having a source coupled to ground, a drain coupled to i) a drain of said second p-type transistor and ii) a gate of said first p-type transistor, and a gate coupled to an inverted copy of said input data signal, wherein a drain current of said first p-type transistor is larger than a drain current of said second p-type transistor for the same gate-to-source voltage, such that said first p-type transistor turns on faster than said second p-type transistor if said first power supply is powered up to VDDI/O when said first and second n-type transistors are off.

2. The voltage level shifter as set forth in claim 1 wherein a size of said first p-type transistor is larger than a size of said second p-type transistor.

3. The voltage level shifter as set forth in claim 2 wherein said first and second n-type transistors are identical.

4. The voltage level shifter as set forth in claim 3 further comprising a first inverter having an input coupled to said input data signal and an output coupled to said gate of said second n-type transistor.

5. The voltage level shifter as set forth in claim 3 further comprising a second inverter having an input coupled to said gate of said second p-type transistor.

6. An integrated circuit comprising:
   core processing circuitry operating at a first power supply level of VDD;
   output stage circuitry operating at a second power supply level of VDDI/O, where VDDI/O is greater than VDD; and
   a voltage level shifter capable of receiving an input signal having a maximum Logic 1 value of VDD and producing an output signal having a maximum Logic 1 value of VDDI/O, said voltage level shifter comprising:
   1) a first circuit branch comprising A) a first p-type transistor having a source coupled to said second power supply level and B) a first n-type transistor having a source coupled to ground, a drain coupled to a drain of said first p-type transistor, and a gate coupled to said input data signal; and
   2) a second circuit branch comprising A) a second p-type transistor having a source coupled to said first power supply and a gate coupled to a drain of said first n-type transistor and B) a second n-type transistor having a source coupled to ground, a drain coupled to i) a drain of said second p-type transistor and ii) a gate of said first p-type transistor, and a gate coupled to an inverted copy of said input data signal, wherein a drain current of said first p-type transistor is larger than a drain current of said second p-type transistor for the same gate-to-source voltage, such that said first p-type transistor turns on faster than said second p-type transistor if said first power supply is powered up to VDDI/O when said first and second n-type transistors are off.

7. The integrated circuit as set forth in claim 6 wherein a size of said first p-type transistor is larger than a size of said second p-type transistor.

8. The integrated circuit as set forth in claim 7 wherein said first and second n-type transistors are identical.

9. The integrated circuit as set forth in claim 8 further comprising a first inverter having an input coupled to said input data signal and an output coupled to said gate of said second n-type transistor.

10. The integrated circuit as set forth in claim 8 further comprising a second inverter having an input coupled to said gate of said second p-type transistor.

11. A voltage level shifter capable of receiving an input signal having a maximum Logic 1 value of VDD and producing an output signal having a maximum Logic 1 value of VDDI/O, where VDDI/O is greater than VDD, said voltage level shifter comprising:
   1) a first circuit branch comprising A) a first p-type transistor having a source coupled to a first power supply having a level of VDDI/O, B) a second p-type transistor having a source coupled to a drain of said first p-type transistor, and C) a first n-type transistor having a source coupled to ground, a drain coupled to a drain of said second p-type transistor, and a gate coupled to a gate of said second p-type transistor and said input data signal; and 2) a second circuit branch comprising A) a third p-type transistor having a source coupled to said first power supply and a gate coupled to a drain of said first n-type transistor, B) a fourth p-type transistor having a source coupled to a drain of said third p-type transistor, and C) a second n-type transistor having a source coupled to ground, a drain coupled to i) a drain of said fourth p-type transistor and ii) a gate of said first p-type transistor, and a gate coupled to a gate of said fourth p-type transistor and an inverted copy of said input data signal, wherein a drain current of said first p-type transistor is larger than a drain current of said third p-type transistor for the same gate-to-source voltage and a drain current of said second p-type transistor is larger than a drain current of said fourth p-type transistor for the same gate-to-source voltage, such that said first and second p-type transistors turns on faster than said third and fourth p-type transistors if said first power supply is powered up to VDDI/O when said first and second n-type transistors are off.

12. The voltage level shifter as set forth in claim 11 wherein a size of said first p-type transistor is larger than a size of said third p-type transistor and a size of said second p-type transistor is larger than a size of said fourth p-type transistor.

13. The voltage level shifter as set forth in claim 12 wherein said first and second n-type transistors are identical.

14. The voltage level shifter as set forth in claim 13 further comprising a first inverter having an input coupled to said input data signal and an output coupled to said gate of said second n-type transistor.

15. The voltage level shifter as set forth in claim 13 further comprising a second inverter having an input coupled to said gate of said third p-type transistor.

16. An integrated circuit comprising:

core processing circuitry operating at a first power supply level of VDD;

output stage circuitry operating at a second power supply level of VDDI/O, where VDDI/O is greater than VDD; and a voltage level shifter capable of receiving an input signal having a maximum Logic 1 value of VDD and producing an output signal having a maximum Logic 1 value of VDDI/O, said voltage level shifter comprising:

1) a first circuit branch comprising A) a first p-type transistor having a source coupled to said second power supply level, B) a second p-type transistor having a source coupled to a drain of said first p-type transistor, and C) a first n-type transistor having a source coupled to ground, a drain coupled to a drain of said second p-type transistor, and a gate coupled to a gate of said second p-type transistor and said input data signal; and 2) a second circuit branch comprising A) a third p-type transistor having a source coupled to said first power supply and a gate coupled to a drain of said first n-type transistor, B) a fourth p-type transistor having a source coupled to a drain of said third p-type transistor, and C) a second n-type transistor having a source coupled to ground, a drain coupled to i) a drain of said fourth p-type transistor and ii) a gate of said first p-type transistor, and a gate coupled to a gate of said fourth p-type transistor and an inverted copy of said input data signal, wherein a drain current of said first p-type transistor is larger than a drain current of said third p-type transistor for the same gate-to-source voltage and a drain current of said second p-type transistor is larger than a drain current of said fourth p-type transistor for the same gate-to-source voltage, such that said first and second p-type transistors turns on faster than said third and fourth p-type transistors if said first power supply is powered up to VDDI/O when said first and second n-type transistors are off.

17. The integrated circuit as set forth in claim 16 wherein a size of said first p-type transistor is larger than a size of said third p-type transistor and a size of said second p-type transistor is larger than a size of said fourth p-type transistor.

18. The integrated circuit as set forth in claim 17 wherein said first and second n-type transistors are identical.

19. The integrated circuit as set forth in claim 18 further comprising a first inverter having an input coupled to said input data signal and an output coupled to said gate of said second n-type transistor.

20. The integrated circuit as set forth in claim 18 further comprising a second inverter having an input coupled to said gate of said third p-type transistor.

* * * * *

UNITED STATES PATENT AND TRADEMARK OFFICE
CERTIFICATE OF CORRECTION

PATENT NO.   : 6,384,631 B1
DATED        : May 7, 2002
INVENTOR(S)  : Joseph D. Wert et al.

It is certified that error appears in the above-identified patent and that said Letters Patent is hereby corrected as shown below:

Column 2,
Line 35, change "VVDI/O" to -- VDDI/O --.

Signed and Sealed this

First Day of July, 2003

JAMES E. ROGAN
*Director of the United States Patent and Trademark Office*